US005611003A

United States Patent [19]
Lesterlin et al.

[11] Patent Number: 5,611,003
[45] Date of Patent: Mar. 11, 1997

[54] ELECTRO-OPTICAL SEMICODUCTOR MODULATOR, AND AN OPTICAL LINK INCLUDING THE MODULATOR

[75] Inventors: Dominique Lesterlin, Vitry sur Seine; Jérôme Langanay, Montrouge; Jean-Guy Provost, Longpont sur Orge, all of France

[73] Assignee: Alcatel N.V., Bh Rijswijk, Netherlands

[21] Appl. No.: 401,676

[22] Filed: Mar. 10, 1995

[30] Foreign Application Priority Data

Mar. 11, 1994 [FR] France .................................. 94 02858

[51] Int. Cl.⁶ ........................................................ G02F 1/015
[52] U.S. Cl. ................... 385/3; 359/248; 385/10
[58] Field of Search ................... 385/1–3, 8–10; 372/96; 359/237, 245, 246, 247, 248

[56] References Cited

U.S. PATENT DOCUMENTS

| 5,004,313 | 4/1991 | TyTan et al. | 385/2 |
| 5,400,417 | 3/1995 | Allie et al. | 385/2 |

FOREIGN PATENT DOCUMENTS 3-57285  3/1991  Japan .

OTHER PUBLICATIONS

*IEEE Photonics Technology Letters*, vol. 4, No. 12, Dec. 1992, New York, US, pp. 1394–1397, J. C. Cartledge et al, "Performance of 10 Gb/s Lightwave Systems using an adjustable chirp optical modulator and linear equalization".
*IEEE Photonics Technology Letters*, vol. 3, No. 1, 1 Jan. 1991, New York, US, pp. 74–76, T. Saito et al, "Prechirp technique for dispersion compensation for a high–speed long–span transmission".

*IEEE Photonics Technology Letters*, vol. 3, No. 10, Oct. 1991, NY, US, pp. 916–918, A. H. Gnauck et al, "Dispersion penalty reduction using an optical modulator with adjustable chirp".
*Patent Abstracts Of Japan*, vol. 17, No. 539 (P–1621) 28 Sep. 1993 & JP–A–05 150198 (NTT).
*Electronics Letters*, vol. 29, No. 11, 27 May 1993, Stevenage, Herts, GB, pp. 1002–1004, Tanaka et al, "Optical short pulse generation and data modulation by a single–chip InGaAsP tandem–integrated electroabsorption modulator".
*Applied Physics Letters*, vol. 53, No. 14, 3 Oct. 1988, NY, US pp. 1297–1298, S. C. Lin et al, "Semiconductor waveguide phase comparator".

*Primary Examiner*—John D. Lee
*Attorney, Agent, or Firm*—Sughrue, Mion, Zinn, Macpeak & Seas

[57] ABSTRACT

An electro-optical semiconductor modulator includes two successive segments (SA, SD) each of which applies both attenuation and a phase shift to a light wave (12) in response to a control voltage for controlling the segment. The two segments belong to the same structure having multiple quantum wells. A control generator (4) develops the AC components of the two control voltages (MA, MD) respectively in the form of two different combinations of a reference attenuation (A) and of a reference phase shift (D) to be applied to the light wave (12). The control generator also supplies two DC components (VA, VD) of the control voltages with two different values that are chosen so as to enable the two combinations to actually apply the attenuation (A) and the phase shift (D) to the wave. The invention is applicable in particular to implementing an optical link having a high data-rate.

7 Claims, 3 Drawing Sheets

ELECTRO-OPTICAL SEMICODUCTOR MODULATOR, AND AN OPTICAL LINK INCLUDING THE MODULATOR

The present invention relates in particular to optical fiber links capable of transmitting at high data-rates such as 10 Gbit/s at λ=1.5 μm.

To implement such a link cheaply, it is necessary to use optical fibers of the "G652" type which have zero chromatic dispersion at λ=1.3 μm, and which offer the advantage of being relatively cheap but suffer from the drawback of having relatively high chromatic dispersion such as 17 pS/μm at λ=1.55 μm. When the length of the link is greater than about 100 km, such chromatic dispersion distorts the transmitted signals to such an extent that the error rate on reception increases to a level that is problematic. To limit such an increase in the error rate, it is known that optical phase variation can be applied to pulse signals carried by amplitude modulation of a light wave, such variation being referred to as phase pre-distortion and being applied to each pulse.

However, known optical links do not make it possible to reconcile the following: use of fibers (such as G652 fibers) having chromatic dispersion that is problematic at the wavelength of the link, long transmission distances, high data-rates, and pre-distortion that appropriately limits the increase in the error rate of the link as a result of the chromatic dispersion of the fibers used.

A particular object of the present invention is to reconcile these elements so as to reduce the error rate of an optical link having a high data-rate.

Japanese Patent Application No. 3 057 285 describes an electro-optical semiconductor modulator including two successive segments, respectively constituting a photo-absorption modulator and a phase-shifter. The photo-absorption modulator segment suffers from a problem: not only does it modulate the amplitude of the light wave passing through it, it also modulates the frequency thereof. To remedy this problem, the phase-shifter segment is controlled so as to create a phase shift that compensates for the parasitic frequency modulation created by the photo-absorption modulator segment. It is even possible to exceed such compensation so as to deliberately create frequency modulation that is superposed on the amplitude modulation. Unfortunately, that modulator suffers from the drawback of being complex and expensive to manufacture, because the two segments are made of different semi-conductor materials. An object of the invention is to make it simple to implement a modulator that enables both the amplitude and the phase of a light wave to be modulated at a high rate.

To these ends, the invention provides, in particular, an electro-optical semiconductor modulator including a light guide that includes two successive segments, each of which applies both attenuation and a phase shift to a light wave, each of the two segments being provided with control electrodes connected to a control generator; each of the two segments having:

an attenuation response to electricity equal to the derivative of the mean absorption coefficient of the segment with respect to a control voltage that caused the variation in the coefficient; and a phase-shift response to electricity equal to the derivative of a phase-shift angle with respect to a control voltage;

the relationship between the attenuation response to electricity and the phase-shift response to electricity being expressed by a "phase-amplitude coupling" factor α defined by the following equation:

$$\frac{d\phi}{dt} = \frac{\alpha}{2} \frac{1}{CA} \frac{dCA}{dt}$$

where t represents time, and CA represents the mean absorption coefficient;

the coupling factor being smaller in an "attenuation" one of the segments than in a "phase-shift" one of the segments;

said modulator being characterized in that the two segments have the same structure, and in that, to obtain a smaller coupling factor in the attenuation segment than in the phase-shift segment, the control generator supplies different DC components to the respective electrodes of the two segments.

It has been found that the invention makes it possible to choose, for the attenuation and phase-shift segments, semiconductor structures and DC components of control voltages such that attenuation and a phase shift that are equal respectively to the reference attenuation and to the reference phase shift are actually applied to the light wave by AC components constituted by two different combinations of the reference attenuation and of the reference phase shift. Such a choice is made possible by using semiconductor structures having multiple quantum wells.

An embodiment of the present invention is described below in more detail by way of non-limiting example and with reference to the diagrammatic figures of the accompanying drawings. Whenever the same element is shown in more than one figure, it is designated by the same reference. In the accompanying drawings.

Figure 1:
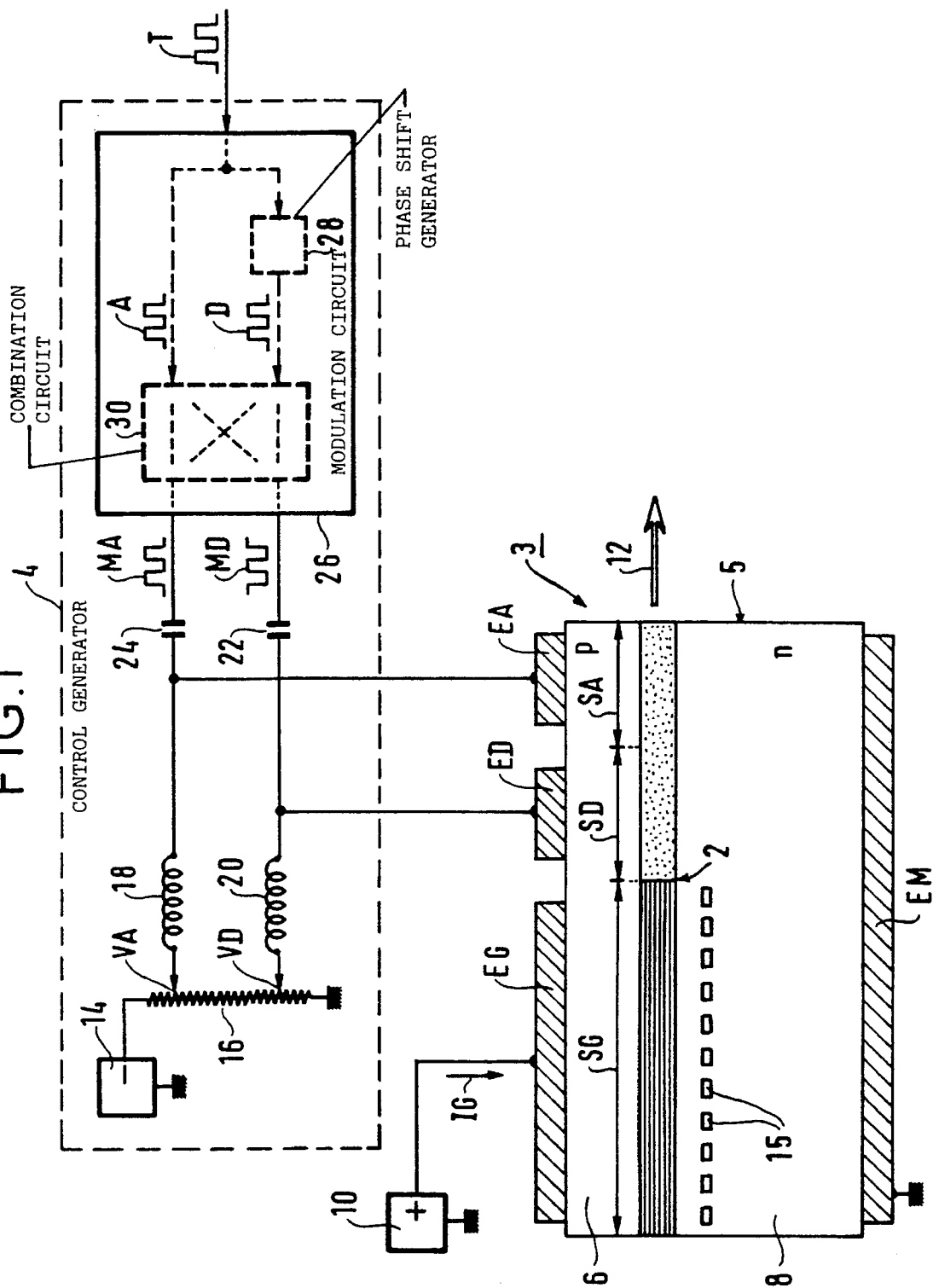
FIG. 1 is a view of a modulator of the invention with a longitudinal section through a semiconductor chip of the modulator.

The electro-optical semiconductor modulator given by way of example includes the following known elements:

A light guide 2 capable of guiding a light wave in a longitudinal direction, and of allowing it to be output at the end of the guide in the form of an output wave 12.

In the example given, the guide is formed in a semiconductor chip 3, its end in question is formed by an end face of the chip, and the end face slopes and/or carries an anti-reflective coating to enable the light wave to be output. The guide exhibits an electro-optical effect capable of modulating the output wave.

Electrodes EA, ED, EM disposed facing the guide.

A control generator 4 capable of receiving an input signal T and of responding by supplying a varying control voltage to the electrodes, thereby creating an electric field in the guide 2 so as to modulate the output wave 12.

In accordance with the present invention, the guide 2 includes two segments extending in succession in the longitudinal direction, namely an attenuation segment SA and a phase-shift segment SD. Each of the two segments has an attenuation response to electricity dCA/dV1 equal to the derivative of the mean absorption coefficient CA of the segment with respect to the control voltage V1 that caused the variation in the coefficient. Each of the two segments also has a phase-shift response to electricity dφ/dV2 equal to the derivative of a phase-shift angle φ with respect to the control voltage V2 that caused the variation in the angle. The angle φ is a function of the mean refractive index of the segment.

The relationship between the attenuation response to electricity and the phase-shift response to electricity of each segment is expressed by a phase amplitude coupling factor α defined by the following equation:

$$\frac{d\phi}{dt} = \frac{\alpha}{2} \cdot \frac{1}{CA} \cdot \frac{dCA}{dt}$$

where t represents time.

The factor α is characteristic of the segment, and it is smaller in the attenuation segment SA than in the phase-shift segment SD.

Said electrodes constitute attenuation electrodes EA & EM disposed facing the attenuation segment SA and phase-shift electrodes ED & EM disposed facing the phase-shift segment SD. They enable two different control voltages to be applied to the two segments, the two different control voltages respectively constituting an attenuation segment control voltage and a phase-shift segment control voltage. Each of the voltages has a DC component and an AC component.

The control generator 4 receives an input signal T defining firstly a reference attenuation A representative of an attenuation variation to be applied to said output wave, and secondly a reference phase shift D representative of an optical phase-shift variation to be applied the wave. The generator responds by supplying firstly the AC component of the attenuation segment control voltage MA in the form of a first combination, e.g. a linear combination:

$$MA = k1.A + k2.D$$

of the reference attenuation A and of the reference phase shift D, and secondly the AC component of the phase-shift segment control voltage MD in the form of a second combination:

$$MD = k3.A + k4.D$$

of the reference attenuation A and of the reference phase shift D. The second combination is, for example, linear, but it is different from the first combination. The coefficients k1, k2, k3, and k4 are constant. The ratio k1/k2 is different from the ratio k3/k4.

The control generator 4 further supplies the DC components VA, VD of the attenuation segment control voltage and of the phase-shift segment control voltage.

In a preferred configuration, the attenuation segment SA and the phase-shift segment SD are constituted by semiconductor structures having multiple quantum wells. In the context of the present invention, it has been found that such structures make it possible to ensure that the difference between the two phase amplitude coupling factors α1 and α2 respectively of the attenuation segment and of the phase-shift segment is large enough to make it practical and cheap to implement a modulator that is suitable for a long-distance optical link such as the link described below. However, it should be understood that other types of structures having electro-optical effects might also be suitable.

Typically, the light guide 2 is formed in a single-crystal semiconductor chip 3 between two confinement layers 6, 8 having opposite conductivity types p & n. Advantageously, it may then further include an amplification segment SG included in a resonant optical cavity and constituted by a material capable of becoming optically amplifying under the action of an injection current IG flowing in a forward direction between the two confinement layers. The resonant cavity is constituted by a distributed Bragg reflector 15 coupled to the guide 2.

Amplification electrodes EG & EM are disposed facing the amplification segment SG, and they are powered by an electrical amplification source 10 so as to cause the injection current to pass in the forward direction between the two confinement layers. The amplification segment then constitutes a DFB laser integrated in the modulator so as to generate a light wave in the guide 2.

The control generator 4 supplies the DC components VA, VD of the attenuation segment control voltage and of the phase-shift segment control voltage so as to prevent current from passing between the confinement layers 6 & 8. Such a current is prevented from passing therebetween either if such a control voltage has a backward direction that is opposite to said forward direction, or else if the voltage has the forward direction but has a value that is lower than a limit dependent on the doping of the layers.

In a configuration making it easier to implement the modulator, both the attenuation segment SA and the phase-shift segment SD have the same structure, giving them equal responses to electricity when they are subjected to varying control voltages that remain equal to each other. However, given that the semiconductor structure is chosen to be common to both segments, the responses depend to a large extent on the DC components VA & VD of the control voltages. The control generator 4 then gives the two DC components VA & VD respective different values so as to give the phase amplitude coupling factor a value that is significantly smaller in the attenuation segment SA than in the phase-shift segment SD.

More particularly, the above-mentioned electrodes constitute a common electrode EM extending over the entire length of the guide 2, and a specific attenuation electrode EA, a specific phase-shift electrode ED, and a specific amplification electrode EG.

The DC components VA & VD of the attenuation segment control voltage and of the phase-shift segment control voltage are supplied to electrodes EA & ED by a DC bias source 14 via a resistive divider 16 and via isolating inductors 18 & 20.

The AC components MA & MD of the control voltages are supplied respectively to those electrodes EA & ED, via coupling capacitors 22 & 24, via a modulation circuit 26 receiving an input signal T directly defining the reference attenuation A. This circuit performs various operations that are represented in the figures by various internal symbolic components. A first such symbolic component is a phase-shift generator 28 which forms the reference phase shift D from the input signal T. A second such symbolic component is a combination circuit 30 which forms the two above-mentioned linear combinations, thereby constituting the two AC components MA and MD.

In practice, in a simple case in which the modulator is used in an optical link which is described below, the two components have variations that are constantly in opposite directions, and that have amplitudes in a constant ratio chosen after testing.

Figure 2:
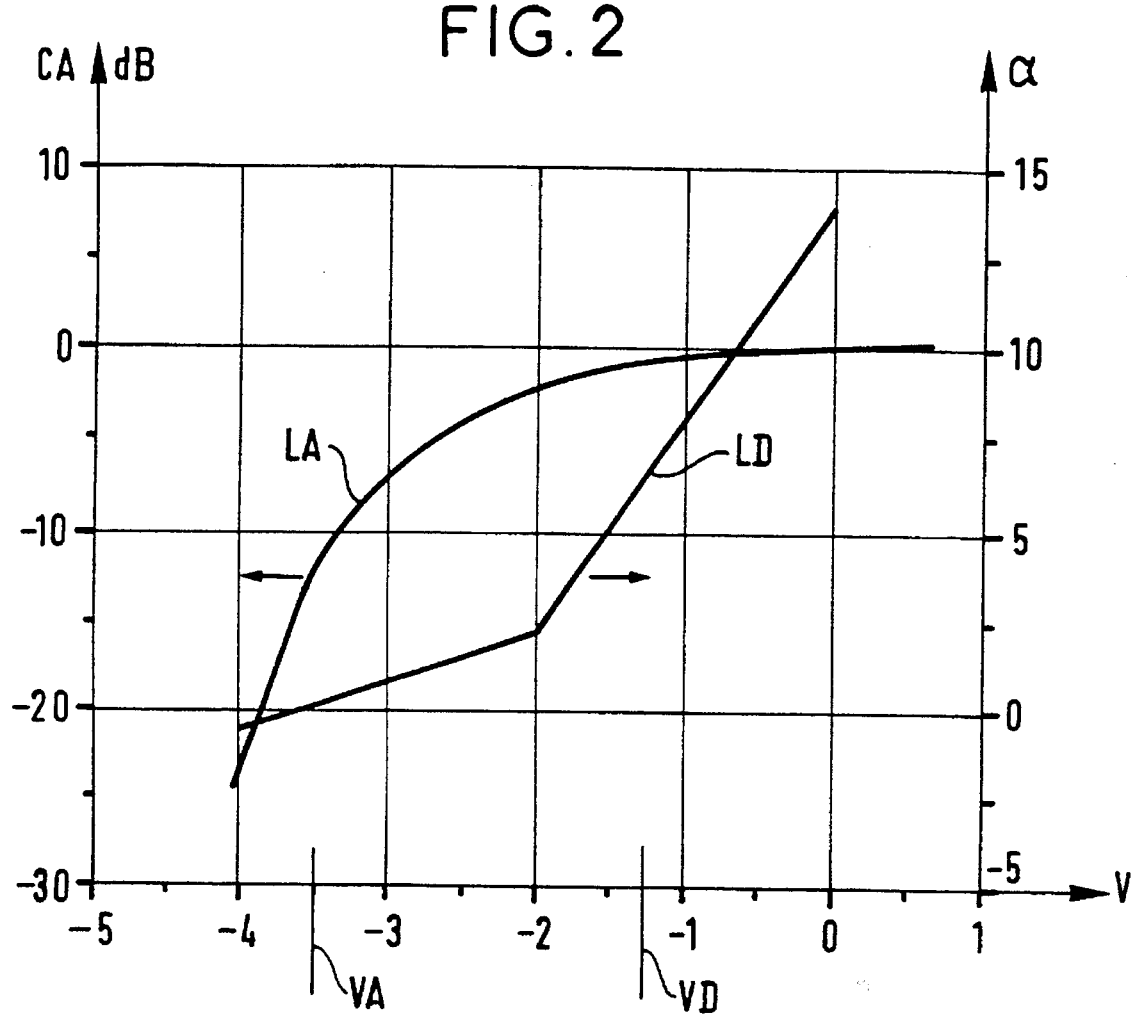
FIG. 2 is a graph showing variations in attenuation and a phase shift applied to a light wave by the chip shown in FIG. 1, the voltages applied to the chip so as to achieve the attenuation and the phase shift being plotted along the X-axis.
Figure 3:
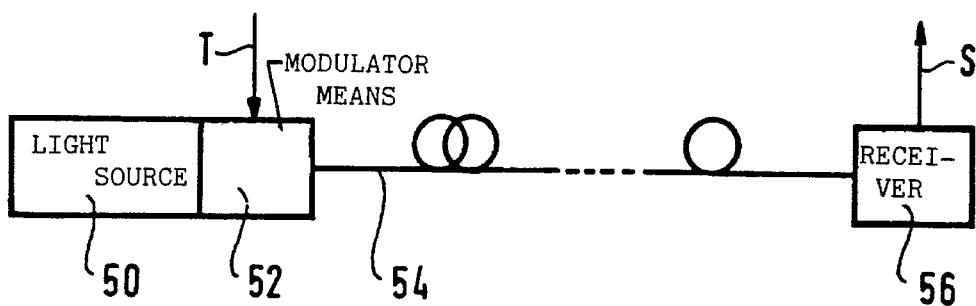
FIG. 3 is a view of an optical link including the modulator shown in FIG. 1.

The choice of the DC components VA & VD appears in FIG. 2 in which the diagrams LA and LD respectively show the variations in the absorption coefficient CA and in the phase-amplitude coupling factor α (which factor defines the phase shift) as a function of the voltage applied in each case between the corresponding specific electrode EA or ED and the common electrode EM. The voltages are shown as being negative because they reverse bias the diode formed by the confinement layers 6 and 8. Voltage VA procures a higher attenuation response to electricity and a lower phase-shift response to electricity than voltage VD.

The diagrams correspond to the above-described choices when the light selected by the Bragg reflector 15 has a wavelength of 1,550 nm.

The present invention also provides an optical link including the following known elements:

A light source 50 for emitting a light wave.

Modulation means 52 receiving an input signal T carrying data to be transmitted and modulating the amplitude of the light wave in response to the signal.

An optical fiber transmission line 54 receiving and guiding the modulated light wave while having chromatic dispersion suitable for causing distortion in the wave.

A receiver 56 receiving the wave at the output of the link and responding by supplying an output signal S, the output signal restoring the data with an error rate that is increased by distortion of the line 54.

Figure 4:
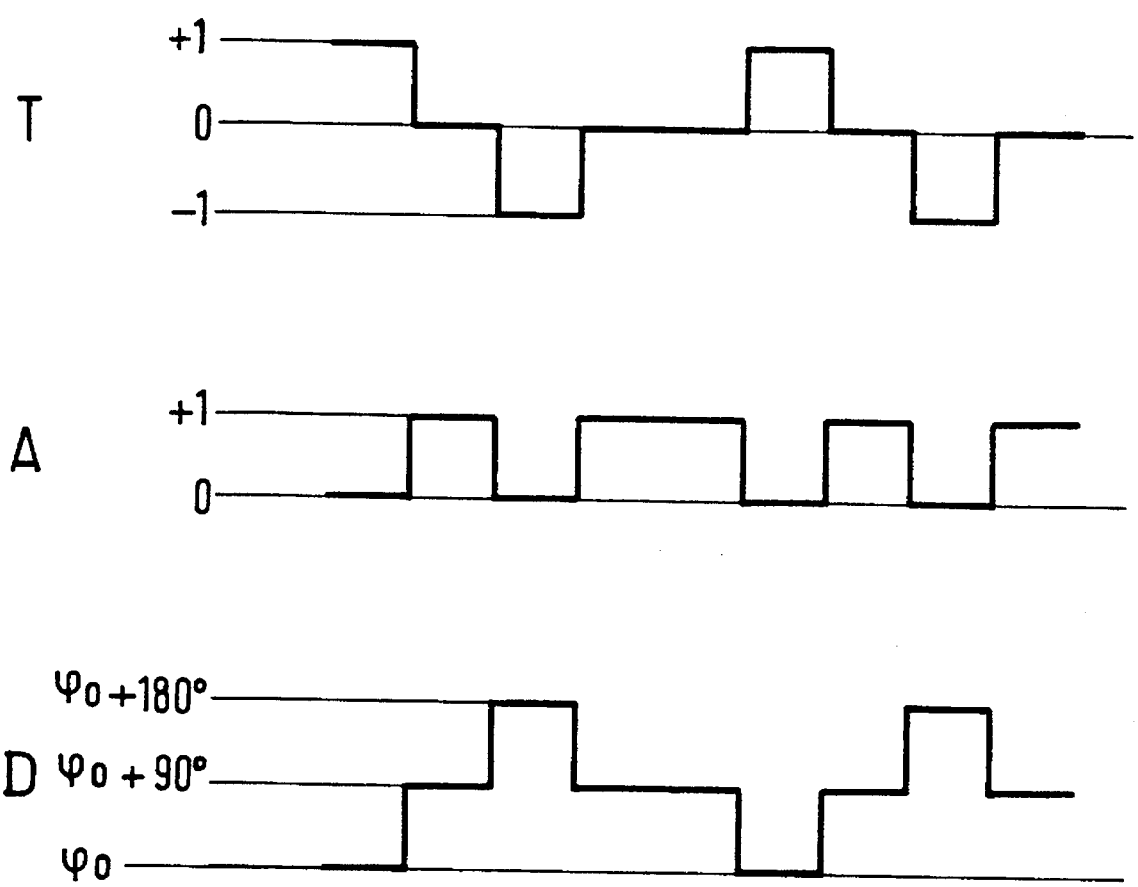
FIG. 4 shows how the modulator of the invention operates in the optical link, for an example of a signal to be transmitted.

In accordance with the present invention, the light source 50 and the modulation means 52 are respectively constituted by the amplification segment SG and by the set of the attenuation and phase-shift segments SA and SD of the above-described modulator. The reference attenuation A being defined directly by the signal to be transmitted T. The control generator develops the reference phase shift D on the basis of the signal to be transmitted T so as to apply a pro-distortion phase shift to the light wave output by the modulator, thereby pro-compensating the chromatic dispersion of the line at least in part. This phase shift is chosen so as reduce the error rate to as low as possible. In an application example illustrated by the timing diagram shown in FIG. 4, the signal to be transmitted T is a duo-binary signal that can take the values −1, 0, or +1. The generator 26 develops a reference attenuation A by taking the 1 s complement (modulo 2) of the absolute value of the signal T, so as to have minimum attenuation when T=±1, and maximum attenuation when T=0. The generator 28 develops a reference phase shift D causing: a pre-distortion phase shift equal to $\phi_0+180°$ when T=−1, $\phi_0+90°$ when T=0, and $\phi_0$ when T=+1, where $\phi_0$ is an arbitrary fixed phase-shift value. By choosing D=$\phi_0$+90° for T=0, in this example the signal D can be derived from signal T very easily by more inversion. It is therefore very simple to implement generator 28.

However, it should be noted that an arbitrary value D can be chosen for T=−1 because, since the attenuation is at its maximum, the optical signal is almost zero during the time intervals when T=0.

We claim:

1. An electro-optical semiconductor modulator including a light guide (2) that includes two successive segments (SA, SD), each of which applies both attenuation and a phase shift to a light wave (12), each of the two segments being provided with control electrodes (EA, EM; ED, EM) connected to a control generator (4); each of the two segments having:

an attenuation response to electricity (dCA/dV1) equal to the derivative of the mean absorption coefficient (CA) of the segment with respect to a control voltage (V1) that caused a variation in the coefficient; and a phase-shift response to electricity (dφ/dV2) equal to the derivative of a phase-shift angle (φ) with respect to a control voltage (V2);

the relationship between the attenuation response to electricity and the phase-shift response to electricity being expressed by a "phase-amplitude coupling" factor α defined by the following equation:

$$\frac{d\phi}{dt} = \frac{\alpha}{2} \frac{1}{CA} \frac{dCA}{dt}$$

where t represents time, and CA represents the mean absorption coefficient;

the coupling factor being smaller in an "attenuation" one of the segments (SA) than in a "phase-shift" one of the segments (SD);

said modulator being characterized in that the two segments (SA, SD) have the same structure, and in that, to obtain a smaller coupling factor in the attenuation segment (SA) than in the phase-shift segment (SD), the control generator (4) supplies different DC components (VA, VD) to the respective electrodes of the two segments.

2. A modulator according to claim 1, characterized by the fact that said attenuation segment (SA) and said phase-shift segment (SD) are constituted by semiconductor structures having multiple quantum wells.

3. A modulator according to claim 1, characterized by the fact that said light guide (2) is formed in a single-crystal semiconductor chip (3) between two confinement layers (6, 8) having opposite conductivity types (n, p);

the guide further including an amplification segment (SG) included in a resonant optical cavity and constituted by a material capable of becoming optically amplifying under the action of an injection current (IG) flowing in a forward direction between the two confinement layers;

the modulator further including amplification electrodes (EG, EM) disposed facing the amplification segment and an electrical amplification source (10) powering the amplification electrodes so as to cause said injection current to pass in said forward direction between the two confinement layers, thereby generating a light wave in the guide, said control generator (4) supplying said DC components (VA, VD) of the attenuation segment control voltage and of the phase-shift segment control voltage with values that prevent current from passing between said confinement layers (6, 8).

4. A modulator according to claim 3, characterized by the fact that said resonant cavity is constituted by a distributed Bragg reflector (15) coupled to said guide (2) in said amplification segment (SG) so that said amplification segment constitutes a DFB laser integrated in said modulator.

5. A modulator according to claim 1, characterized in that the control generator (4) further supplies two different AC components to the respective electrodes (EA, EM; ED, EM) of the attenuation segment and of the phase-shift segment, in the form of two different linear combinations (k1.A+k2.D; k3.A+k4.D) of a reference attenuation (A), and of a reference phase shift (D).

6. An optical link including:

a light source (50) for emitting a light wave;

modulation means (52) receiving an input signal (T) carrying data to be transmitted, and modulating the amplitude of the light wave in response to the signal;

an optical fiber transmission line (54) receiving and guiding the modulated light wave while having chromatic dispersion suitable for causing distortion in said wave; and a receiver (56) receiving said wave at the output of the link and responding by supplying an output signal (S), the output signal restoring said data with an error rate that is increased by said distortion;

said link being characterized by the fact that said light source (50) and said modulation means (52) are respectively constituted by said amplification segment (SG) and by the set of said attenuation and phase-shift segments (SA and SD) of the modulator according to claim 3, a reference attenuation (A) being defined directly by said signal to be transmitted;

and by the fact that said control generator develops a reference phase shift (D) on the basis of said signal to be transmitted (T) so as to apply a pre-distortion phase shift to said light wave pre-compensating said chromatic dispersion of the line at least in part so as to reduce said error rate.

7. An optical link according to claim 6, characterized in that, to transmit a signal (T) which is a duo-binary signal that can take the values $-1$, 0, or $+1$, said control generator (4) includes means for supplying a reference attenuation (A) derived from the signal to be transmitted (T) by complementing the absolute value of the signal to be transmitted (T); and means (28) for supplying a reference phase shift (D) causing: a phase shift $\phi_0+180°$ for a signal to be transmitted (T) equal to $-1$, an arbitrary phase shift for a signal to be transmitted (T) equal to 0, and a phase shift $\phi_0+0°$ for a signal to be transmitted (T) equal to $+1$, where $\phi_0$ is an arbitrary fixed phase-shift value.

* * * * *